(12) United States Patent
Miljak

(10) Patent No.: US 9,335,390 B2
(45) Date of Patent: May 10, 2016

(54) APPARATUS FOR DETECTING SIGNALS

(75) Inventor: David Miljak, Jannali (AU)

(73) Assignee: COMMONWEALTH SCIENTIFIC AND INDUSTRIAL RESEARCH ORGANISATION, Australian Capital Territory (AU)

( * ) Notice: Subject to any disclaimer, the term of this patent is extended or adjusted under 35 U.S.C. 154(b) by 762 days.

(21) Appl. No.: 13/513,443

(22) PCT Filed: Nov. 29, 2010

(86) PCT No.: PCT/AU2010/001600
§ 371 (c)(1),
(2), (4) Date: Jun. 1, 2012

(87) PCT Pub. No.: WO2011/066600
PCT Pub. Date: Jun. 9, 2011

(65) Prior Publication Data
US 2012/0242340 A1 Sep. 27, 2012

(30) Foreign Application Priority Data
Dec. 2, 2009 (AU) .............................. 2009905897

(51) Int. Cl.
*G01R 33/421* (2006.01)
*G01R 33/341* (2006.01)
*G01R 33/422* (2006.01)
(Continued)

(52) U.S. Cl.
CPC ............ *G01R 33/341* (2013.01); *G01R 33/422* (2013.01); *G01R 33/3628* (2013.01); *G01R 33/441* (2013.01)

(58) Field of Classification Search
CPC ............... G01R 33/341; G01R 33/422; G01R 33/3628; G01R 33/411; G01R 33/34; G01R 33/36
USPC ........... 324/318, 322, 300, 307, 309; 600/422
See application file for complete search history.

(56) References Cited

U.S. PATENT DOCUMENTS

| 5,396,174 A | 3/1995 | Hanke et al. |
| 5,594,342 A | 1/1997 | Brey et al. |

(Continued)

FOREIGN PATENT DOCUMENTS

| CN | 101294919 | 10/2008 |
| CN | 101405612 | 4/2009 |

(Continued)

OTHER PUBLICATIONS

"Balun Transformers", May 3, 2007, minicircuits.com.*
(Continued)

*Primary Examiner* — Melissa Koval
*Assistant Examiner* — Rishi Patel
(74) *Attorney, Agent, or Firm* — Brooks Kushman P.C.

(57) ABSTRACT

An apparatus for detecting magnetic resonance signals from a target, comprises a magnetic resonance sensor for responding to magnetic resonance signals from a target, and a shield member electrically isolated from the magnetic resonance sensor, the shield member being positioned relative to the magnetic resonance sensor such that when the magnetic resonance sensor faces the target, the shield member is behind the magnetic resonance sensor to at least partially shield the magnetic resonance sensor from magnetically coupling with sources other than the magnetic resonance signals.

30 Claims, 10 Drawing Sheets

(51) Int. Cl.
*G01R 33/36* (2006.01)
*G01R 33/44* (2006.01)

(56) References Cited

U.S. PATENT DOCUMENTS

| | | | |
|---|---|---|---|
| 6,028,429 A * | 2/2000 | Green et al. | 324/318 |
| 6,249,121 B1 * | 6/2001 | Boskamp | G01R 33/34061 |
| | | | 324/318 |
| 6,498,487 B1 | 12/2002 | Haner | |
| 6,636,039 B1 | 10/2003 | Nistler | |
| 6,888,153 B2 | 5/2005 | Hayes | |
| 7,327,137 B1 | 2/2008 | Crowley et al. | |
| 7,671,586 B2 | 3/2010 | Crowley et al. | |
| 7,932,721 B2 | 4/2011 | Nascimento et al. | |
| 2004/0027125 A1 | 2/2004 | Clarke et al. | |
| 2004/0086052 A1 | 5/2004 | Engel et al. | |
| 2004/0189300 A1 | 9/2004 | Burl et al. | |
| 2005/0059882 A1 * | 3/2005 | Tropp | 600/422 |
| 2006/0020403 A1 | 1/2006 | Pusiol | |
| 2006/0084861 A1 | 4/2006 | Blank et al. | |
| 2006/0197633 A1 | 9/2006 | Lee | |
| 2007/0096731 A1 | 5/2007 | Peshkovsky et al. | |
| 2009/0093337 A1 | 4/2009 | Soliman et al. | |
| 2009/0251145 A1 | 10/2009 | Kaneko et al. | |
| 2010/0164492 A1 | 7/2010 | Leussler | |

FOREIGN PATENT DOCUMENTS

| | | |
|---|---|---|
| EP | 1359429 | 11/2003 |
| EP | 1703295 | 9/2006 |
| GB | 2277160 | 10/1994 |
| WO | 0178089 | 10/2001 |
| WO | 2006043275 | 4/2006 |
| WO | 2007109426 | 9/2007 |
| WO | 2007117604 | 10/2007 |
| WO | 2008104895 | 9/2008 |
| WO | 2010033241 | 3/2010 |

OTHER PUBLICATIONS

"Controlled Power Company" Sep. 8, 2008, SureImage.*
"Power Condition Model Ultra-K/M" May 12, 2008, Sureimage.*
"Electromagnetic shielding" Nov. 12, 2009, Wikipedia.org.*
International Search Report for PCT/AU2010/001600, Completed by the Australian Patent Office on Feb. 8, 2011, 4 Pages.
Australian Examination Report for Australian Application No. 2010327357, Dated May 19, 2014, 4 Pages.
Extended European Search Report for EP 10834080.3, Completed by the European Patent Office, Dated Apr. 19, 2013, 12 Pages.
Supplemental Search Report for EP 0834080, Dated Apr. 12, 2013, 4 Pages.
Vaals et al. Journal of Magnetic Resonance Sep. 1, 1990, vol. 89, No. 2, p. 331-342, XP 000159805 "Novel High-Frequency Resonator for NMR Imaging and Spectroscopy".
Misic et al. Book of Abstracts of the meeting and exhibition of the society of magnetic resonance in medicine Aug. 20, 1988, vol. 2, p. 853, XP 000088161, "Doubly Resonant Faraday Shielded Surface Coil for Simultaneous phosphorus and hydrogen acquisition at 1.5 tesis".
Burl et al. Screended/ Shielded Coils Aug. 1, 1996, vol. 36, No. 2, p. 326-330, XP 000625808, "Examples of the Desing of Screenced and Shielded RF Received Coils".
Gleich et al. IEEE Transactions of Biomedical Engineering Jun. 1, 2005, vol. 52, No. 6, p. 1094-1102, XP 011132094, "A safe Transmission Line for MRI".

* cited by examiner

APPARATUS FOR DETECTING SIGNALS

CROSS-REFERENCE TO RELATED APPLICATIONS

This application is the U.S. national phase of PCT Appln. No. PCT/AU2010/001600 filed on Nov. 29, 2010, which claims priority to AU Patent Application No. 2009905897 filed on Dec. 2, 2009, the disclosures of which are incorporated in their entirety by reference herein.

FIELD

The present invention relates to an apparatus suitable for detecting Magnetic Resonance (MR) signals.

BACKGROUND

MR sensors based on Faraday Law detection may couple to both electric and magnetic field components of Radio Frequency Interference (RFI). This RFI is known to emanate from both natural and man-made sources. Electric coupling can occur when common mode voltages on the sensor structure are generated through capacitive coupling to ambient electric fields (such as RF electric field voltages and gradients due to being in close proximity to human limbs). Magnetic coupling can occur when RFI magnetic fields thread the aperture of the sensor used for detection. These magnetic fields may originate from distant transmitters or close-in sources such as nearby power transmission mains wiring.

In applications, such as medical imaging, electromagnetic shielding (such as an electrically conductive box or a shielded room) is used to prevent extraneous RFI from interfering with the MR signal. However, such techniques are not suitable in many potential applications of MR detection. For example, it is not practical to use electromagnetic shielding for bulk material such as mineral containing material being moved on a conveyor or if the MR detection device needs to be portable.

SUMMARY OF THE INVENTION

In a first aspect, the invention provides an apparatus for detecting magnetic resonance signals from a target, comprising:

a magnetic resonance sensor for responding to magnetic resonance signals from a target; and a shield member electrically isolated from the magnetic resonance sensor, the shield member being positioned relative to the magnetic resonance sensor such that when the magnetic resonance sensor faces the target, the shield member is behind the magnetic resonance sensor to shield the magnetic resonance sensor from magnetically coupling with sources other than the magnetic resonance signals.

In an embodiment, the apparatus further comprises a magnetic resonator electrically isolated from the shield member and the magnetic resonance sensor, the magnetic resonator being adapted to resonate and scatter the magnetic field towards the target to at least partially compensate for magnetic coupling of sources other than the target with the magnetic resonance sensor.

In an embodiment, the shield member is substantially flat.

In an embodiment, the shield member is substantially dished-shaped so as to define a concave side and an opposing convex side.

In an embodiment, the magnetic resonance sensor is positioned on the concave side of the shield member.

In an embodiment, the magnetic resonator is positioned on the convex side of the shield member.

In an embodiment, the magnetic resonance sensor is encompassed within the shield member.

In an embodiment, the shield member is encircled by the magnetic resonator.

In an embodiment, the magnetic resonance sensor comprises a first tuning element adapted to tune the magnetic resonance sensor to operate at about a predetermined operating frequency; and the magnetic resonator comprises a second tuning element adapted to tune the magnetic resonator to a resonance below the predetermined operating frequency.

In an embodiment, the magnetic resonance sensor and the magnetic resonator are substantially circular.

In an embodiment, the depth of the concavity of the shield member is at least 30% of the diameter of the magnetic resonance sensor.

In an embodiment, the shield member comprises a plurality of perforations.

In an embodiment, the shield member is composed of a mesh.

In an embodiment, the magnetic resonance sensor is a single turn loop or ribbon.

In an embodiment, the magnetic resonance sensor is a multi turn loop or ribbon.

In an embodiment, the magnetic resonator is a single turn loop or ribbon.

In an embodiment, the magnetic resonator is a multi turn loop or ribbon.

In an embodiment, the apparatus comprises:

an output; and an isolation circuit arranged between the magnetic resonance sensor and the output to transfer electrical energy from the magnetic resonance sensor to the output while reducing electrical energy electrically coupled to the magnetic resonance sensor from transferring to the output.

In an embodiment, the apparatus further comprises a compensation circuit connected to the isolation circuit and the output to compensate for electrical energy due to electric coupling within the isolation circuit.

In an embodiment, the isolation circuit is an isolation transformer.

In an embodiment, the isolation transformer comprises:

a primary winding connected to the magnetic resonance sensor; and a secondary winding connected to the output, the secondary winding being referenced to a system voltage.

In an embodiment, the compensation circuit comprises:

a capacitor connected to the primary winding of the isolation transformer; and a voltage inverting circuit connected to the capacitor.

In an embodiment, the capacitor is connected halfway along the length of the primary winding of the isolation transformer.

In an embodiment, the inverting circuit is a 1:1 impedance ratio transformer with counter-fed windings.

In an embodiment, the magnetic resonance sensor comprises an inductor and at least one capacitor.

In an embodiment, each of the capacitors are arranged symmetrically relative to the inductor.

In an embodiment, the inductor is a single turn inductive loop or ribbon.

In an embodiment, the inductor is a multi turn inductive coil.

In an embodiment, the apparatus comprises at least one pair of voltage distribution electrodes in proximity to, but electrically isolated from, the magnetic resonance sensor, each pair of voltage distribution electrodes being arranged symmetrically relative to a line of symmetry defined by a midline of the magnetic resonance sensor which extends through the isolation circuit, the voltage distribution electrodes being electrically connected to enable formation of an equipotential.

In an embodiment, at least one pair of voltage distribution electrodes is connected by an electrical connector extending across an aperture of the magnetic resonance sensor.

In an embodiment, the voltage distribution electrodes are linked by an electrical connector extending along an edge of the magnetic resonance sensor.

In an embodiment, there are at least two pairs of voltage distribution electrodes and some of the electrodes are linked by electrical connectors extending between neighbouring electrodes.

In an embodiment, a thickness of each voltage distribution electrode is less than the electrical skin depth of a material from which each voltage distribution electrode is formed.

In an embodiment, each voltage distribution electrode is uniformly spaced from the magnetic resonance sensor.

In a second aspect, the invention provides an apparatus for detecting magnetic resonance signals, comprising:
a magnetic resonance sensor arranged to respond to magnetic resonance signals;
an output; and
an isolation circuit arranged between the magnetic resonance sensor and the output to transfer electrical energy from the magnetic resonance sensor to the output while reducing electrical energy electrically coupled to the magnetic resonance sensor from transferring to the output.

In an embodiment, the apparatus further comprises a compensation circuit connected to the isolation circuit and the output to compensate for electrical energy due to electric coupling within the isolation circuit.

In an embodiment, the isolation circuit is an isolation transformer.

In an embodiment, the isolation transformer comprises:
a primary winding connected to the magnetic resonance sensor; and
a secondary winding connected to the output, the secondary winding being referenced to a system voltage.

In an embodiment, the compensation circuit comprises:
a capacitor connected to the primary winding of the isolation transformer; and
a voltage inverting circuit connected to the capacitor.

In an embodiment, the capacitor is connected halfway along the length of the primary winding of the isolation transformer.

In an embodiment, the inverting circuit is a 1:1 impedance ratio transformer with counter-fed windings.

In an embodiment, the magnetic resonance sensor comprises an inductor and at least one capacitor.

In an embodiment, each of the capacitors are arranged symmetrically relative to the inductor.

In an embodiment, the inductor is a single turn inductive loop or ribbon.

In an embodiment, the inductor is a multi turn inductive coil.

In an embodiment, the apparatus comprises at least one pair of voltage distribution electrodes in proximity to, but electrically isolated from, the magnetic resonance sensor, each pair of voltage distribution electrodes being arranged symmetrically relative to a line of symmetry defined by a midline of the magnetic resonance sensor which extends through the isolation circuit, the voltage distribution electrodes being electrically connected to enable formation of an equipotential.

In an embodiment, at least one pair of voltage distribution electrodes is connected by an electrical connector extending across an aperture of the magnetic resonance sensor.

In an embodiment, the voltage distribution electrodes are linked by an electrical connector extending along an edge of the magnetic resonance sensor.

In an embodiment, there are at least two pairs of voltage distribution electrodes and some of the electrodes are linked by electrical connectors extending between neighbouring electrodes.

In an embodiment, a thickness of each voltage distribution electrode is less than the electrical skin depth of a material from which each voltage distribution electrode is formed.

In an embodiment, each voltage distribution electrode is uniformly spaced from the magnetic resonance sensor.

DETAILED DESCRIPTION

Figure 1:
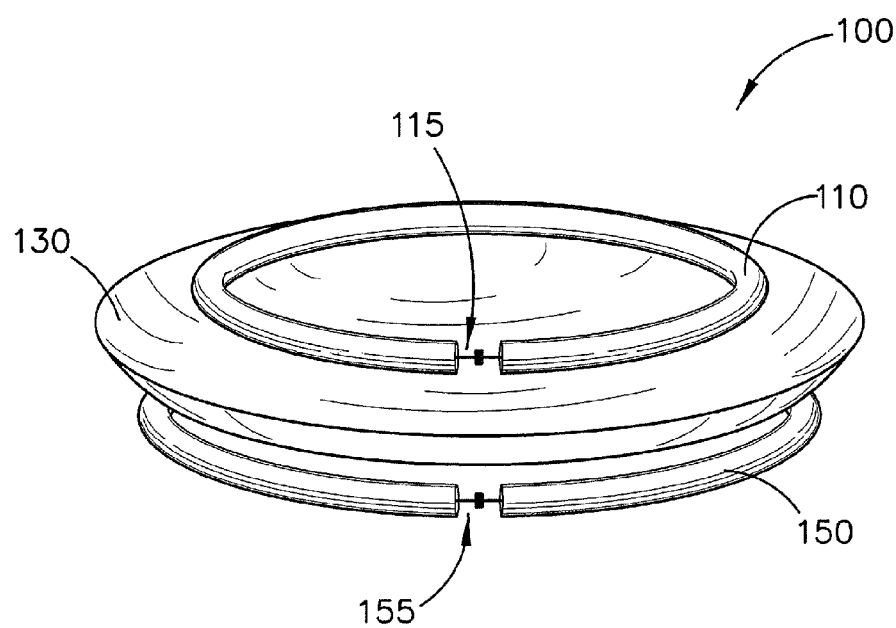
FIG. 1 is a perspective view of an apparatus for detecting magnetic resonance signals.

Herein the term "magnetic resonance" (MR) refers to both Nuclear Magnetic Resonance (NMR) and Nuclear Quadrupole Resonance (NQR). NMR and NQR are methods having wide application in measurement and characterisation of materials. These methods are routinely used as a laboratory tool to investigate bonding and molecular structure. They have also found use in realtime detection and characterisation of minerals and other substances such as narcotics or explosives. There are many classes of NMR and NQR; for example, zero-field NMR in magnetically ordered materials, or double resonance NQR. For the purposes of the specification, all subclasses of NMR or NQR are included in the term "magnetic resonance".

Referring to the drawings, there is shown an apparatus suitable for detecting magnetic resonance signals, comprising a magnetic resonance sensor arranged to respond to magnetic resonance signals. The apparatus has components for reducing the effects of magnetic coupling and electric coupling on the magnetic resonance sensor. Persons skilled in the art, will appreciate that while it is advantageous to address both magnetic coupling and electric coupling, improvements to performance of a magnetic resonance sensor can also be obtained by only addressing one of them.

Herein, "electric coupling" refers to the situation where the unwanted output terminal voltage is driven predominantly by interfering electric fields. Herein, "magnetic coupling" refers to the alternative or additional case where the unwanted terminal voltage is predominantly driven by interfering magnetic fields. Strictly speaking, for non-zero frequency disturbances the interfering magnetic and electric fields are in any case coupled through Maxwell's equations. However, the terms "electric coupling" and "magnetic coupling" still retain meaning in, for example, a quasi-static approximation to the interference problem.

Electric coupling may occur, for instance, when common mode voltages on the sensor structure are generated through capacitive coupling to ambient electric fields. These voltages may result in sensor terminal voltages due to asymmetrical impedance distribution on each side of the sensor terminals. Alternatively, electric field gradients can contribute to terminal voltages, even in the case of symmetric impedance distribution at the terminal. The problem of electric coupling is especially severe in close proximity to human limbs, which may support significant RF electric field voltages and gradients.

Magnetic coupling occurs when radiofrequency interference (RFI) magnetic fields thread the aperture of the inductor used for Faraday detection. These magnetic fields may originally emanate from distant transmitters located in the far field. In this case the inductor used for detection behaves as a small loop antenna receiver. Other close-in sources may also contribute to RFI magnetic fields, such as nearby power transmission mains wiring.

In the embodiments of FIGS. 1 to 11, as in most MR measurements, radiofrequency (RF) electromagnetic near-fields from the MR sensor are employed to excite resonances in materials. That is, in these embodiments, as in many applications known in the art, the MR sensor may be used to both excite and detect MR signals. The configuration of sensors to provide both excitation of resonances in materials and detection of MR signals is known to persons skilled in the art. However, in the case where excitation of resonances in materials is provided by other apparatus, the embodiment may be used to detect MR signals only.

Depending on the application, the sensor RF near fields may be applied to materials either in the form of discrete pulses or as a continuous wave (CW) excitation. The response of the material may be regarded as a time varying magnetisation having an associated RF magnetic field. Thus, RF field excited due to sample magnetisation by the applied stimulus impinges on the near-field region of a sensor and voltages are developed at output terminals of the sensor. These terminal voltages are proportional to the time rate change of magnetic flux threading the sensor aperture, thus enabling magnetic resonance signals to be detected and processed.

Figure 8:
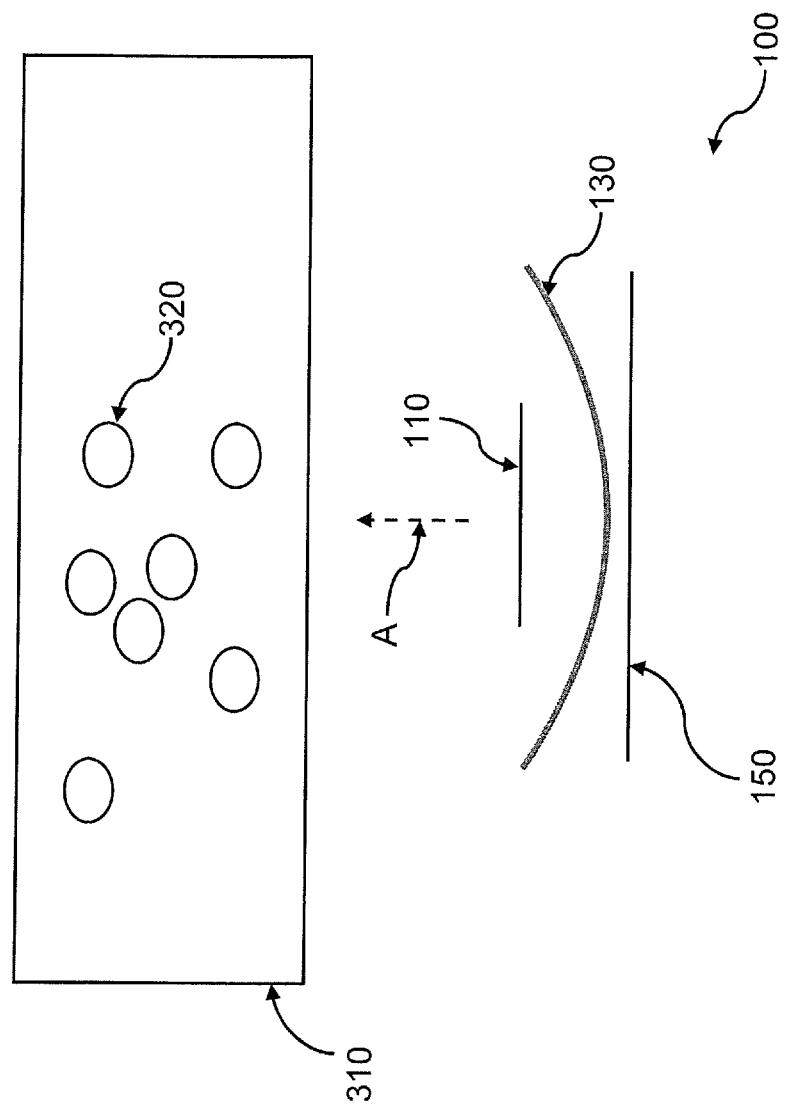
FIG. 8 shows a typical relationship of the apparatus relative to a target.

FIG. 1 is a schematic perspective view which illustrates the physical arrangement of the apparatus 100 for detecting magnetic resonance signals of the embodiment. The purpose of the physical arrangement shown in FIG. 1 is to reduce interference due to magnetic coupling. FIG. 8, is a schematic plan view of the apparatus in one application where the target sample is material 320 on a conveyor 310, which shows the apparatus 100 facing the target sample as indicated generally by arrow A. The apparatus 100 comprises a magnetic resonance sensor 110 adapted to respond to magnetic resonance signal, a shield member 130 electrically isolated from the MR sensor 110 and adapted to shield the magnetic resonance sensor from magnetic coupling, and a magnetic resonator 150 electrically isolated from the shield member 130 and the magnetic resonance sensor 110.

It will be appreciated that the elements of the apparatus 100 set up a reference frame which enable attribution of mitigation of the effect of sources of magnetic coupling to particular components of the apparatus. That is, when the magnetic resonance sensor 110 faces the target, the shield member 130 is behind the magnetic resonance sensor to shield the magnetic resonance sensor 110 from magnetic coupling with sources other than magnetic resonance signal from the target. Magnetic coupling which is not, or cannot, be blocked by the shield member 130 is at least partially compensated for by the magnetic resonator 150 as describe in further detail below.

In this embodiment, the magnetic resonance sensor 110 is a circular single turn inductive loop having tuning elements and output circuitry 115. The tuning elements tune the magnetic resonance sensor 110 to about or close to a desired or predetermined magnetic resonance operating frequency when the displacement between the magnetic resonance sensor 110 and the shield member 130 is fixed in a given configuration. The tuning elements 115 also enable the desired excitation to be delivered. Such tuning elements are well understood in the art and accordingly are not described herein. The output allows a magnetic resonance signal voltage to be obtained.

Persons skilled in the art will appreciate that the magnetic resonance sensor 110 need not be a circular single turn loop. For example, the shape of the magnetic resonance sensor can be different and/or can be a multi-turn loop or a ribbon etc. Persons skilled in the art will appreciate that a number of factors will influence the selection of the type and shape of MR sensor 110, including the desired operating frequency of the MR sensor and/or the application of the MR sensor. For example at lower frequencies, a multi-turn loop is advantageous as it reduces the physical size of the required tuning capacitance. Similarly, if the device is to be a hand held device, a more elongate shape rather than a circle may be preferred such that the overall dimensions of the device are not unwieldy.

In FIG. 1, the shield member 130 is a dished, circular conductive member. It is envisaged however that the shield member need not be circular but in alternative embodiments can be elliptical or rectangular to match or complement the shape of the MR sensor. The magnetic resonator 150 is a circular single turn loop having tuning elements 155, the tuning elements 155 being adapted to tune the magnetic resonator 150 to exhibit a resonance below the desired or predetermined magnetic resonance operating frequency when the magnetic resonator 150 is electrically isolated. As with the MR sensor, in other embodiments, the magnetic resonator 150 can also be multi-turn coil or a non-circular inductor.

In the apparatus 100 of FIG. 1, the diameter around the rim of the shield member 130 is in excess of the diameter of the magnetic resonance sensor 110. Persons skilled in the art will appreciate however that the diameter around the rim of the shield member 130 can also be approximately equal to the magnetic resonance sensor 110 if less "shielding" is required. In the apparatus of FIG. 1, the diameter of the magnetic resonator 150 is approximately equal to the diameter around the rim of the shield member 130. Persons skilled in the art will appreciate however that the diameter of the magnetic resonator 150 may be in excess of the diameter around the rim of the shield member 130 to provide greater resonance compensation.

The magnetic resonance sensor 110 is exposed so that one side of the inductive loop can face a target to detect magnetic resonance signals from the non-shielded side of the sensor.

The shield member 130 is positioned behind the magnetic resonance sensor 110 so that the convex side of the shield member 130 can shield the magnetic resonance sensor 110 from magnetically coupling with sources other than magnetic resonance signal from the target. The magnetic resonator 150 is positioned behind the shield member 130 so that it can scatter the magnetic field towards the target (and hence the MR sensor 110) to at least partially compensate for any magnetic coupling that may occur between sources other than the target and the magnetic resonance sensor 110.

Thus, in use, the apparatus 100 is directed at a target sample 320 so that one side of the magnetic resonance sensor faces the target 320 to detect magnetic resonance signals from the target. By directing the apparatus towards the target, the magnetic resonance sensor 110 responds to magnetic resonance from the target 320. Generally speaking, the response may be regarded as a time varying magnetisation having an associated RF magnetic field which impinges on a near-field region of the magnetic resonance sensor 110. The terminal voltage is proportional to the time rate change of magnetic flux threading the magnetic resonance sensor aperture.

Figure 2:
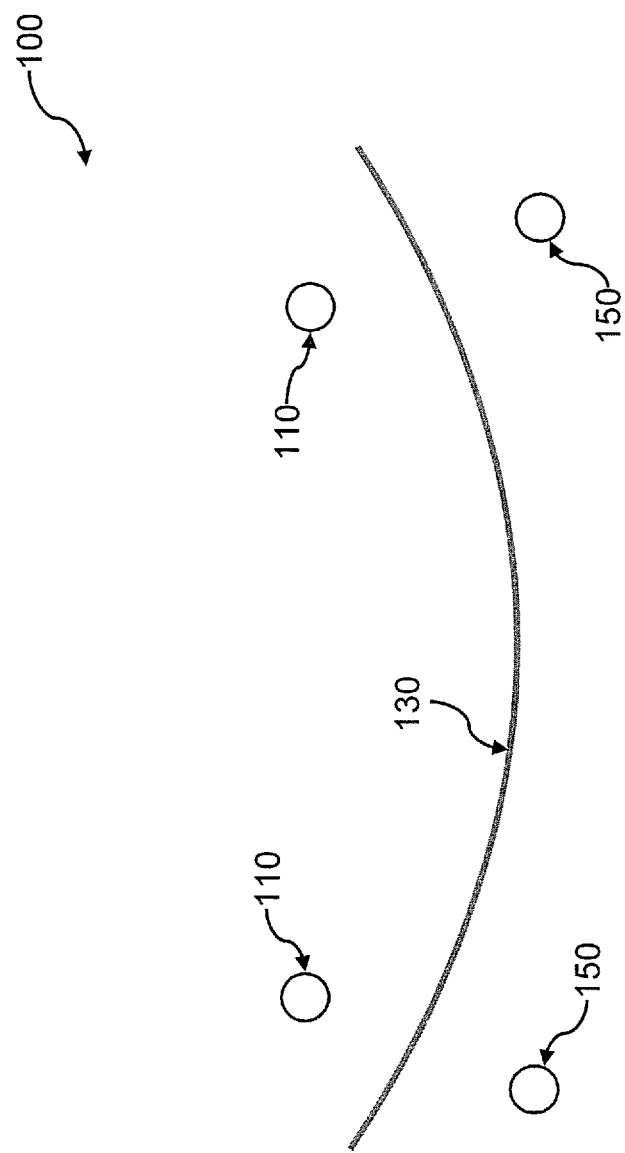
FIG. 2 is a cross-sectional view of the apparatus shown in FIG. 1.

A cross-sectional view of the apparatus 100 is illustrated in FIG. 2 which shows that the shield member 130 is dished-shaped. The shield member 130 thus has a concave side and an opposing convex side. It is advantageous if the maximum depth of the concavity of the shield member is at least 30% of the diameter of the magnetic resonance sensor. The concavity provided by the dished shield member is advantageous in that it reduces the potential for eddy currents to be developed in the shield member during transmission and reception of signals, thereby maintaining transmission efficiency (flux per unit available power) of the MR sensor and the receive efficiency (delivered power at sensor terminals for a given flux generated by the target sample).

In this embodiment, the magnetic resonance sensor 110, the shield member 130 and the magnetic resonator 150 are arranged in a symmetric "stacked" arrangement so as to provide a high degree of suppression for magnetic coupling by interfering fields. The conductivity and thickness of the shield member is such that it significantly rejects incident magnetic field from penetrating through the wall of the shield member. In this respect, it will be appreciated that the shield member reduces the effect of interfering fields but does not (and does not need to) completely suppress their effect.

The magnetic resonance sensor 110 is positioned in a manner such that there is a gap between the magnetic resonance sensor 110 and shield member 130 so that the two are electrically isolated from one another. In an embodiment, this gap can be created by a non-conductive material such as Perspex sheet(s). Persons skilled in the art will appreciate however that any suitable non-conductive separator can be used to electrically separate the magnetic resonance sensor 110 and shield member 130 and that the separator may take the form of flat sheets or stand-offs such as a series of leg members between the MR sensor 110 and the shield member 130. The magnetic resonator 150 is similarly positioned in a manner such that there is also a gap between the magnetic resonator 150 and the shield member 130 so that the two are electrically isolated from one another again by a suitable non-conductive material. In practice, the displacement between the magnetic resonator 150 and the shield member 130 is be determined by trial and error by moving the magnetic resonator towards or away from the shield member (in a controlled environment when the apparatus is otherwise not operating) and determining a point where the resonance of the magnetic resonator "nulls" any unwanted magnetic coupling—i.e. by determining what displacement minimises unwanted magnetic coupling not blocked by the shield member 130. Once the displacement is determined, the magnetic resonator is fixed at this distance—e.g. with stand-offs. It will be appreciated that once the distance has been determined for a particular set of components and operating frequency it can be replicated. An alternative method of fixing the magnetic resonator position is to set the magnetic resonator at a position that provides an approximate null through a trial and error process. The tuning of the magnetic resonator may then be trimmed in the determined position to obtain an improved null.

Persons skilled in the art will appreciate that the concavity of the shield member 130 and the displacement between the magnetic resonance sensor 110 and shield member 130 can be varied according to a variety of factors including the desired amount of sensitivity of the magnetic resonance sensor 110, the quality of magnetic resonance response sensed by the magnetic resonance sensor 110 and the desired amount of shielding required against magnetic coupling between the magnetic resonance sensor 110 etc. Persons skilled in the art will appreciate that the displacement between the magnetic resonator 150 and the shield member 130 is also dependent on a number of factors including the amount of resonance compensation required. It is envisaged that the displacement of the rim of the shield member to the magnetic resonance sensor may be varied according to desired characteristics of the RFI coupling suppression.

Figure 3:
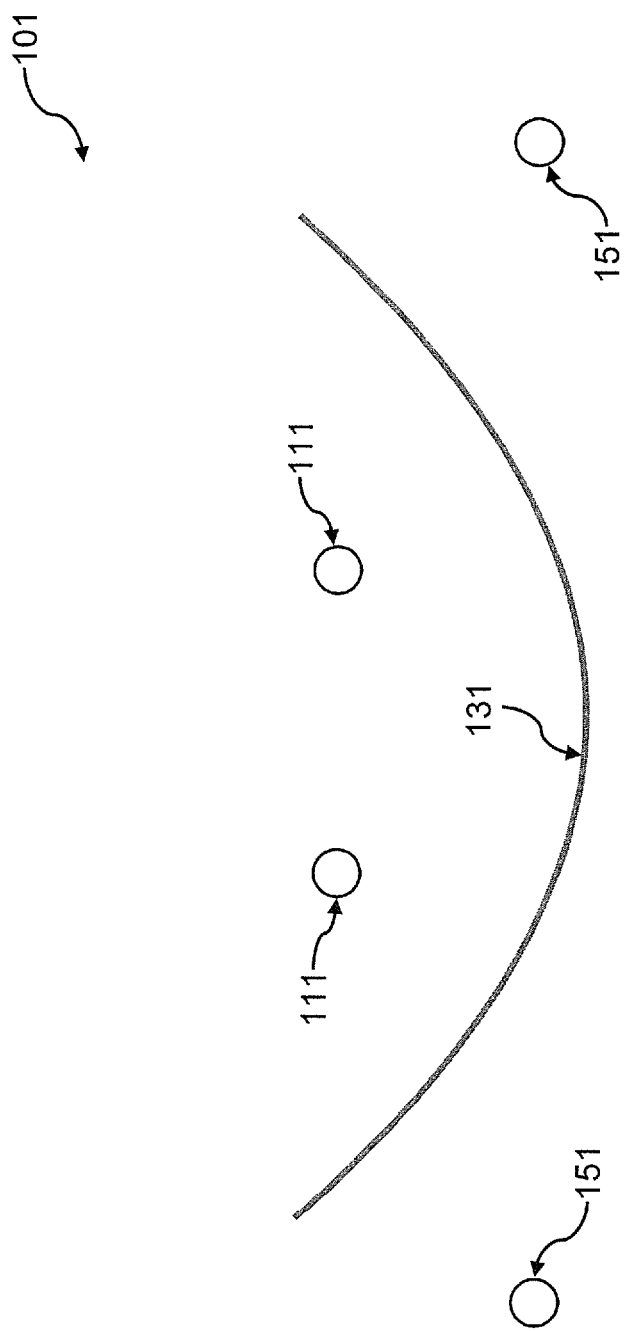
FIG. 3 is a cross-sectional view of an alternative apparatus for detecting magnetic resonance signals.

A cross-sectional view of one such alternative apparatus for detecting magnetic resonance signals 101 is illustrated in FIG. 3. The apparatus also comprises a magnetic resonance sensor 111, a shield member 131 and a magnetic resonator 151.

In this embodiment, the shield member 131 is also dished-shaped but the concavity of the shield member 131 is much greater than the embodiment shown in FIG. 2.

In this embodiment, the diameter of the magnetic resonance sensor 111 is smaller than the diameter of the rim of the shield member 131. The magnetic resonance sensor 111 is positioned relative to the shield member 131 such that the shield member 131 encompasses the magnetic resonance sensor 111.

As shown in FIG. 3, the diameter of the magnetic resonator 151 is in excess of the diameter of the rim of the shield member 131. The magnetic resonator 151 is positioned relative to the shield member 131 such that the magnetic resonator 151 encircles the shield member 131.

Accordingly, it will be appreciated that the apparatus 100, 101 is capable of detecting magnetic resonance signals even in the presence of magnetic fields originating from distant transmitters or nearby power transmission mains wiring. It will also be appreciated that while the most advantage is derived from the combination of the shield member and the resonator, some advantage can be obtained in an apparatus which has only one of them, particularly, by using a shield member with a concavity.

Persons skilled in the art will appreciate that the specific construction of the apparatus will vary from implementation to implementation. In an example apparatus suited to scanning small items, the magnetic resonance sensor can be formed from a single loop having a diameter of 108 mm, the shield member can be bowl shaped and have a diameter of 136 mm and the magnetic resonator can be a ribbon having a diameter of 160 mm. The elements are arranged such that the total stacked height is 59 mm.

Figure 4:
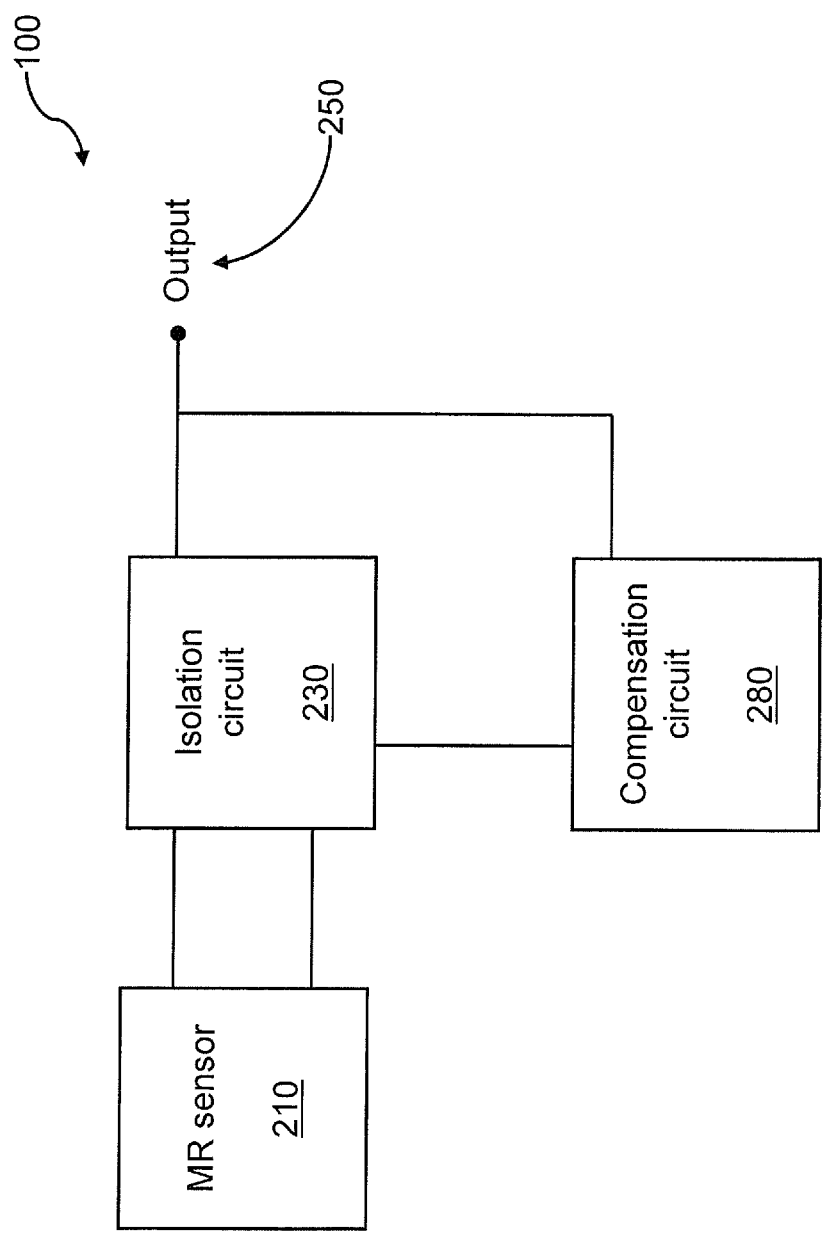
FIG. 4 is a block diagram of the apparatus for detecting magnetic resonance signals.

FIG. 4 is a block diagram illustrating the circuit components of the embodiment of the apparatus which shows the components which are used to reduce electric coupling. FIG. 4 does not show the shield member 130 or the magnetic resonator as these are not electrically coupled to the MR sensor 110. Persons skilled in the art will appreciate that while the components for reducing electrical coupling are described as being used in combination with the MR sensor arrangement of FIG. 2, they could be employed separately.

In the block diagram of FIG. 4, the circuit equivalent of the physical magnetic sensor 110 is the magnetic resonance sensor circuit 210. Accordingly, the apparatus 100 comprises a magnetic resonance sensor circuit 210 adapted to respond to magnetic resonance signals, an output 250, an isolation circuit 230 arranged between the magnetic resonance sensor circuit 210 and the output 250 to transfer electrical energy from the magnetic resonance sensor circuit 210 to the output 250 while reducing electrical energy electrically coupled to the magnetic resonance sensor circuit 210 from transferring to the output 250, and a compensation circuit 280 connected to the isolation circuit 230 and the output 250 to compensate for electrical energy due to electric coupling within the isolation circuit 230.

Figure 5:
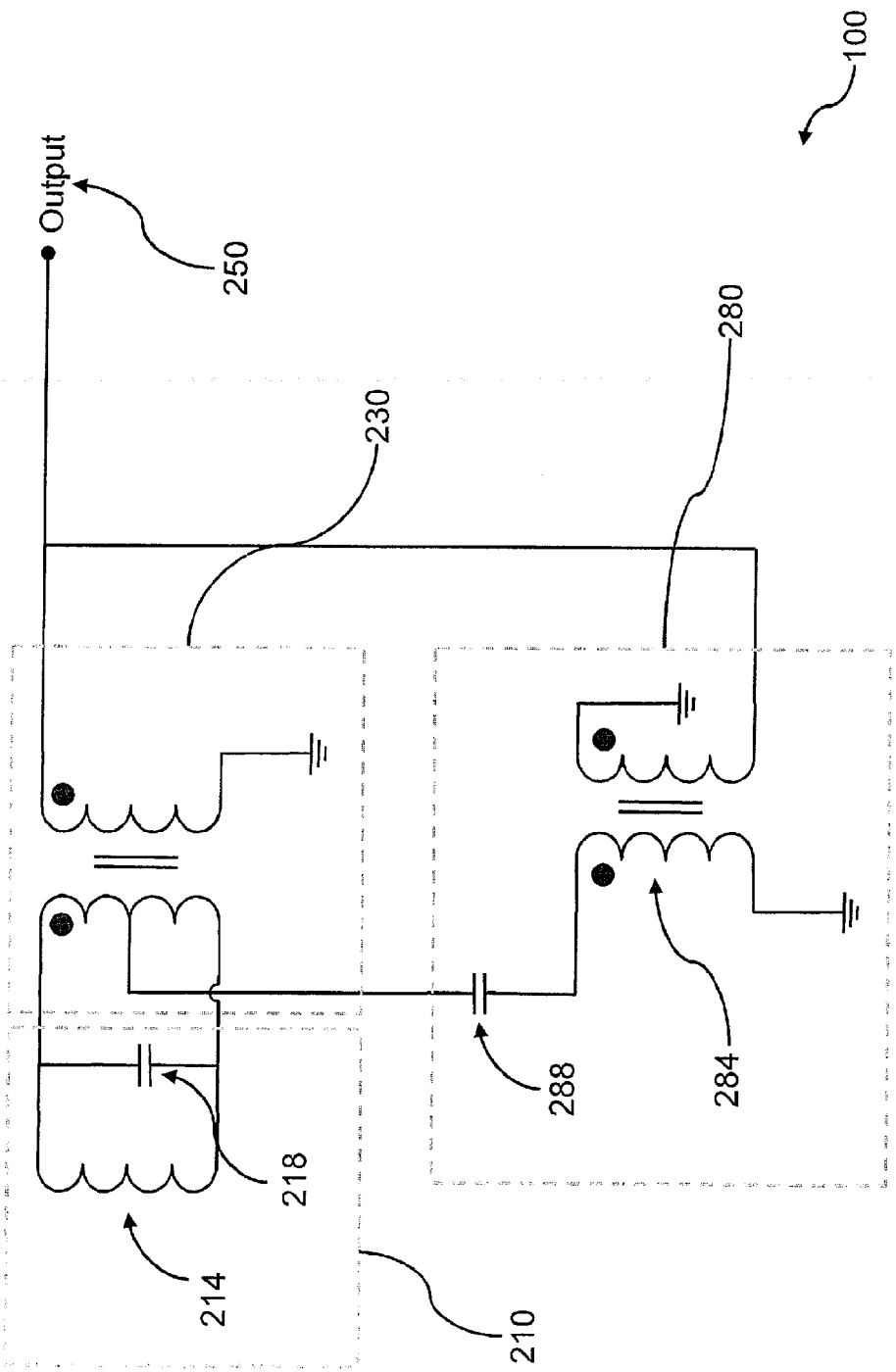
FIG. 5 is a circuit diagram of the apparatus shown in FIG. 4.
Figure 6:
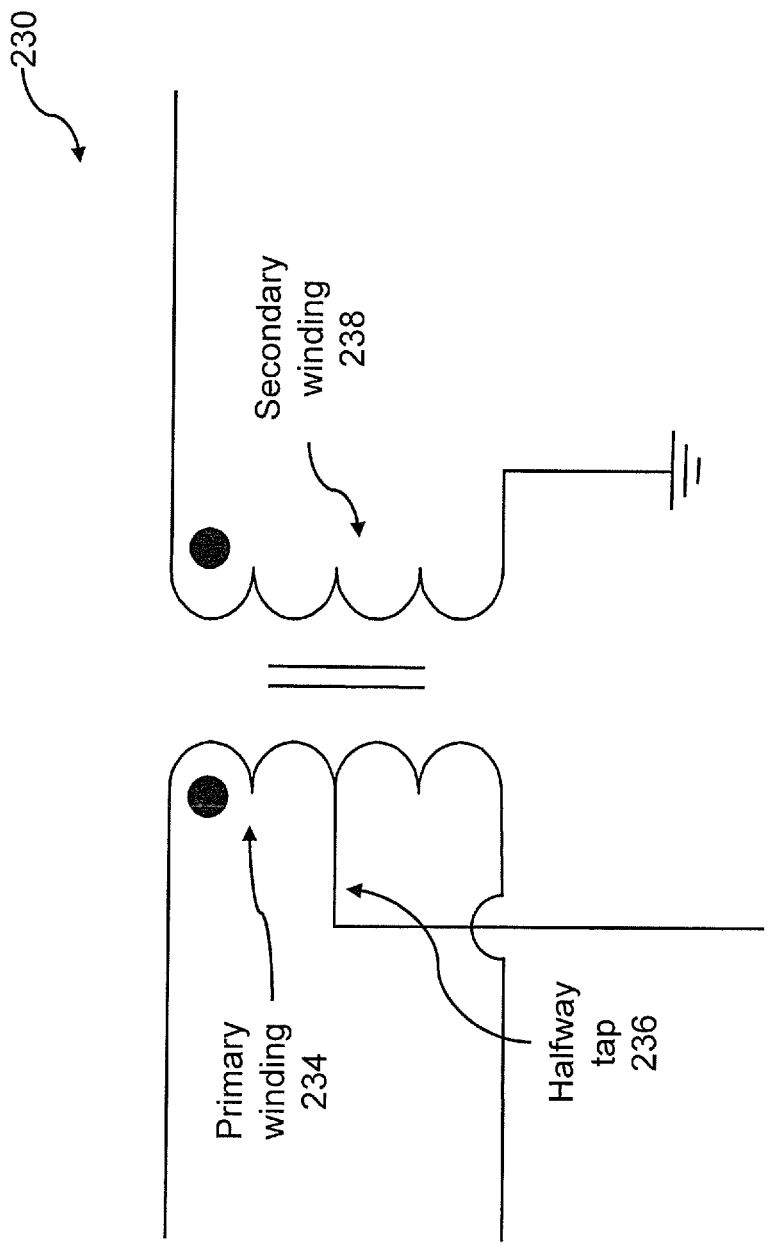
FIG. 6 is a circuit diagram of the isolation circuit shown in FIG. 5.

An exemplary circuit diagram of the apparatus 100 is illustrated in FIG. 5. A detailed view of the isolation circuit 230 of the apparatus 100 is shown in FIG. 6.

As shown in FIG. 5, the magnetic resonance sensor circuit 210 comprises an inductive coil 214 connected to a matching network for tuning the coil. In another example, the inductive coil may also be a single turn circular loop having high symmetry. In this embodiment, the matching network comprises a capacitor 218. Persons skilled in the art will appreciate that the matching network may comprise different elements depending on the desired operating characteristics such as the desired magnetic resonance operating frequency. Regardless of the number of elements in the matching network, it is advantageous if the elements are approximately balanced between each side of the inductive coil 214—i.e. highly symmetrical.

In FIG. 5, the isolation circuit 230 is an isolation transformer. A detailed view of the isolation circuit 230 is provided in FIG. 6 which shows that the primary winding 234 of the isolation transformer is connected to the matching network 218. The secondary winding 238 of the isolation transformer is connected to the output 250 and referenced to ground. Persons skilled in the art will appreciate that the secondary winding may be referenced to any system voltage and that the isolation transformer may also serve the purpose of impedance matching transformation.

In this embodiment, the isolation transformer acts to electrically "float" the active elements of the magnetic resonance sensor circuit 210 (that is, the inductive coil 214 and the matching network 218). The primary winding 234 of the transformer floats with these elements.

In this way, the magnetic resonance sensor circuit 210 and primary winding 234 can rise to a voltage that can prevent current flow between the magnetic resonance sensor circuit 210 and external voltage sources. Thus, even if the magnetic resonance sensor circuit 210 has a significant common mode voltage (which may be generated on the MR sensor through capacitive coupling to ambient electric fields), the isolation imparted by the isolation transformer reduces the amount of this voltage (or prevents portion of this voltage) from appearing at the output 250.

The compensation circuit 280 illustrated in FIG. 5 comprises a capacitor 288 and a voltage inverting circuit 284 connected to the capacitor. In this embodiment, the capacitor 288 is connected via a halfway tap 236 connected halfway along the length of the primary winding 234 of the isolation transformer 230. (In practical terms, this capacitor may not tap the primary winding 234 of the isolation transformer at a point exactly halfway along its length while still acting adequately to provide compensation.) Persons skilled in the art will appreciate that the capacitance value of the capacitor 288 can be set to minimize any voltage due to electric coupling at the output. In the apparatus of FIG. 5, the voltage inverting circuit 284 is a 1:1 impedance ratio transformer with counter-fed windings which is connected directly to the output. Persons skilled in the art will appreciate that other voltage inverting devices can be used for example, an amplifier circuit.

The compensation circuit 280 compensates for imperfect isolation between the primary and secondary windings 234, 238 of the isolation transformer because of interwinding capacitance. Specifically, the compensation circuit 280 compensates for imperfect isolation by reducing common mode currents transmitted through the transformer. In this embodiment, if the current through the capacitor 288 connected to the halfway tap 236 has similar magnitude to that in the interwinding capacitance, then cancellation of additional unwanted common mode voltage at the output can occur. It is envisaged that other compensation or "neutralisation" techniques can also be used to similarly limit the effect of common mode current on the output. Further it will be appreciated that some advantage is obtained by using the isolation circuit without the compensation circuit.

Figure 7:
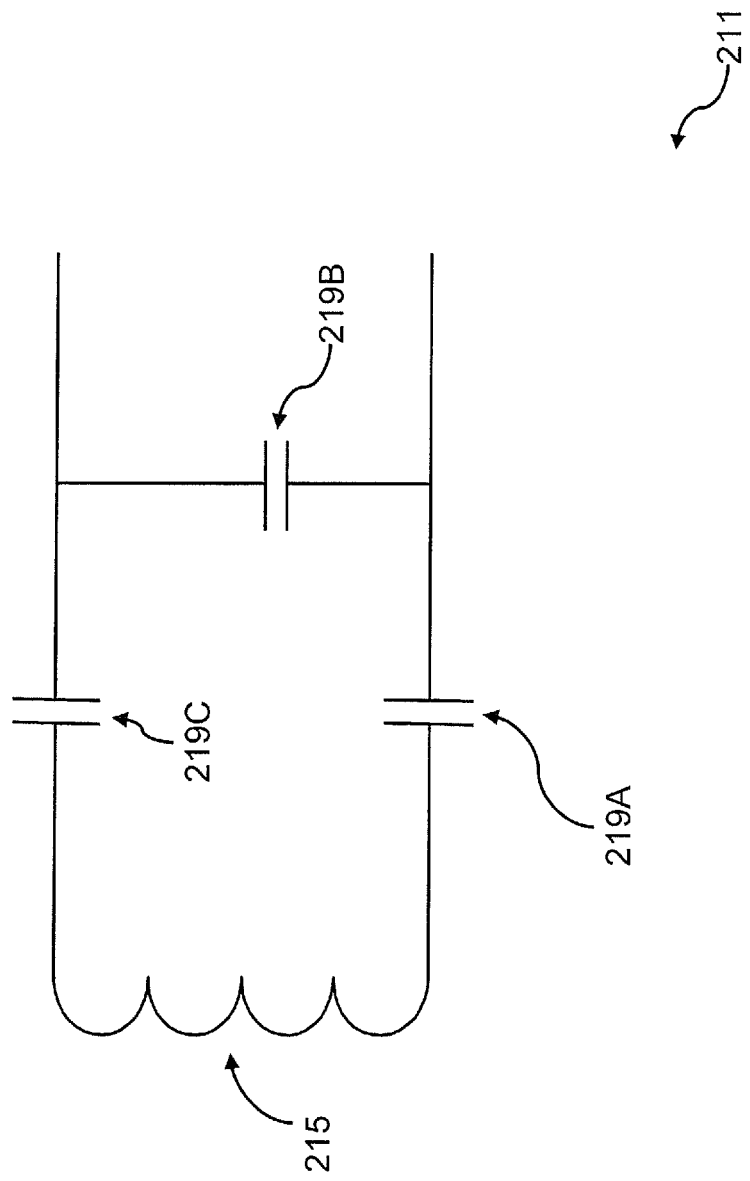
FIG. 7 is a circuit diagram of an alternative magnetic resonance sensor.

FIG. 7 is a circuit diagram of an alternative MR resonance sensor 211. The MR resonance sensor 211 comprises an inductive coil 215 and capacitors 219A, 219B, 219C arranged symmetrically relative to the inductive coil 215. In this embodiment, the inductive coil 215 is a multi-turn coil. However, it is envisaged that a circular single turn loop or any design having high symmetry and low impedance to allow for a simple tuning design and low sensitivity to field gradients can also be used.

One or more embodiments of the present application can be used in a wide variety of applications. For example, an embodiment can be used to detect specific minerals in bulk material in open plant environments (such as conveyors, slurry systems, boreholes or rock faces), detect narcotics and explosives carried on humans or in parcels in realtime, and measure and characterize materials in laboratories to investigate bonding and molecular structure.

In an alternative embodiment, it is envisaged that the shield member may be flatter to be flat or near flat. It is envisaged that with such a flat shield member configuration, the magnetic resonance sensor will be positioned closer to the shield member to obtain high interference rejection and so as to ensure that the magnetic resonance sensor is sufficiently insensitive to the magnetic resonator. For example, it is envisaged that the magnetic resonance sensor will be positioned closer to the shield member in the flat shield member configuration when compared to the positioning of the magnetic resonance sensor relative to the shield member in a dish-shaped shield member configuration. This close proximity results in a significant increase in eddy currents in the flat plate relative to the shield member with a concavity during transmission and reception of signals. These eddy currents result in losses that lower both the transmission efficiency and also the receive efficiency (delivered power at sensor terminals for a given flux generated by the target sample reduced) relative to the above dished shaped plate. The increase in eddy currents is an additional loss in the system. Loss in lumped reactive elements can be specified by the "quality" of the reactance (and hence the MR sensor). The quality can be defined as the ratio of stored energy and energy dissipated per cycle in the reactance.

Accordingly, such embodiments are more suited to applications where there is high available power for the MR sensor, or where the transmitted flux is provided through another "exciter"—i.e. not by the MR sensor.

Figure 9:
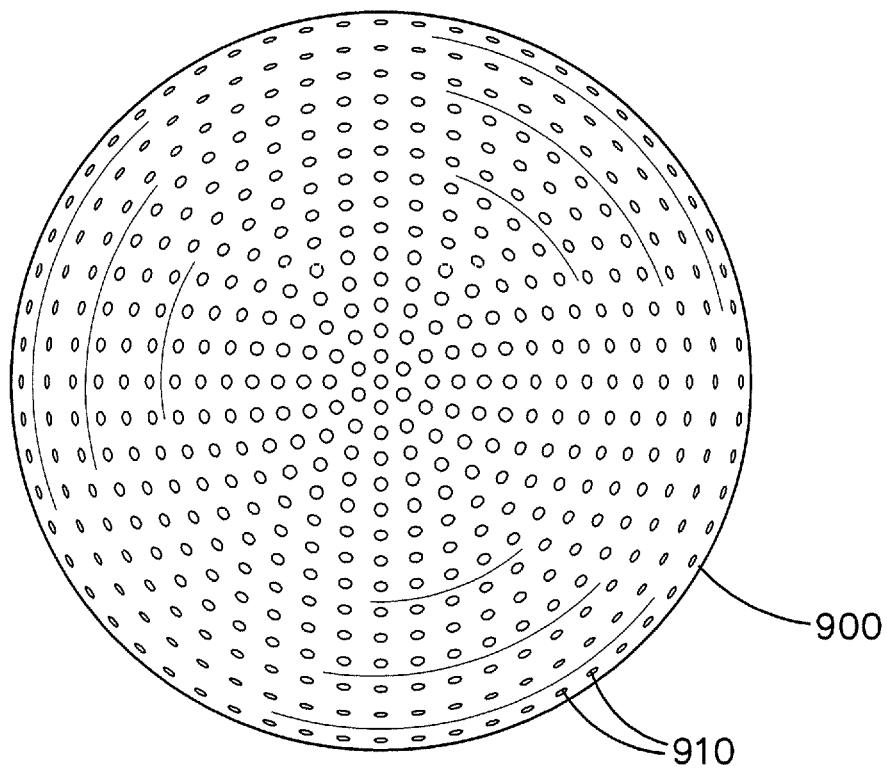
FIG. 9 show an example of a shield member with perforations.

In some embodiments, it is advantageous that the shield member has some perforations to increase the magnetic coupling between the magnetic resonance sensor and the magnetic resonator. The control of the coupling by this mechanism allows variation in the spacing between elements of the apparatus, leading to improved sensitivity with judicious spacing of elements. The perforations may take the form of circular holes or holes of other shape to allow additional magnetic flux to thread both the magnetic resonance sensor and magnetic resonator, thereby modifying the coupling between these elements. The spacing of holes may be arranged regularly in the form of a mesh. The holes may also be arranged in an array. FIG. 9 shows an example of embodiment where the shield member 900 contains perforations 910. Depending on the embodiment, the perforations may cover up to 50% of the surface area.

In other embodiments, a sieve type mesh is possible, but meshes may be employed where the conducting elements are flattened and present a larger area than what is normally associated with a sieve. In other embodiments, the mesh may be formed of conducting elements carried by a supporting material, such as by being woven into a fabric. In practice a bonded-type mesh (where metal crossovers have physical bonding rather than just touching) is the most advantageous.

In other embodiments, the above apparatus is modified to provide for the mitigation of the effects of asymmetrically applied voltages across the magnetic resonance sensor. Asymmetric voltages may occur, for example, when positioning one side of the sensor in closer proximity to a voltage disturbance than the other side of the sensor. The asymmetric voltage distribution may drive unequal currents through the isolation circuit, giving rise to an apparent magnetic resonance signal. To counteract this effect multiple floating electrodes (i.e., electrodes that make no physical contact with either the magnetic resonance sensor, shield member or magnetic resonator) are placed near the magnetic resonance sensor at close proximity to enable formation of an equipotential. Due to the incorporation of an isolation circuit, a symmetry axis exists through the midline of the magnetic resonance sensor 110, defined through the centre of the isolation circuit 115 and the opposing point on the magnetic resonance sensor which is shown as line A-A in FIGS. 10A and 11A. Electrodes that are oppositely disposed to each other with reference to this line of symmetry are joined to each other by conducting wires or ribbons.

Figure 10A:
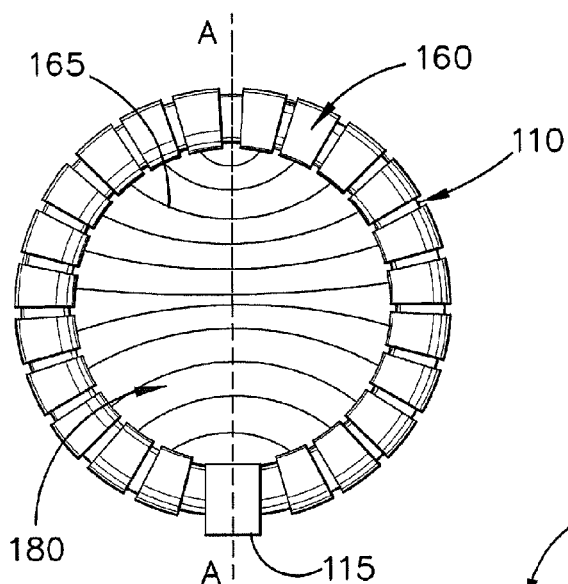
FIGS. 10A and 10B show a first example of a magnetic resonator incorporating a set of floating electrodes.
Figure 10B:
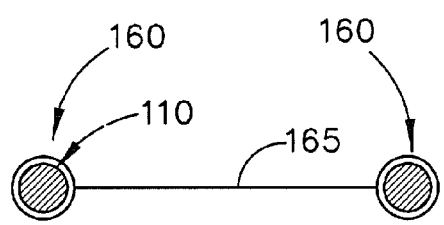

FIGS. 10A and 10B show an embodiment, where wires 165 joining the oppositely opposed electrodes 160 run across the aperture 180 of the magnetic resonance sensor 110.

Figure 11A:
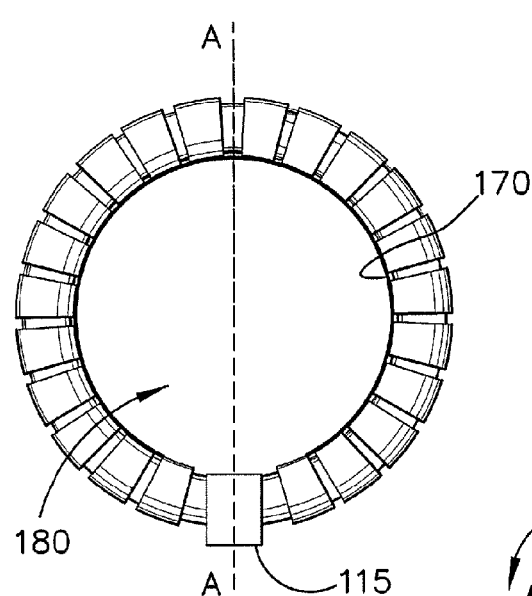
FIGS. 11A and 11B show a second example of a magnetic resonator incorporating a set of floating electrodes.
Figure 11B:
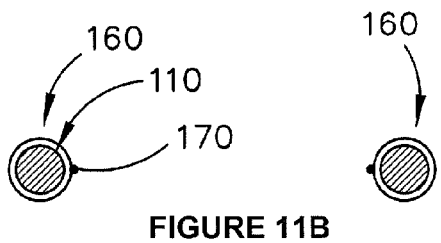

FIGS. 11A and 11B show an alternative embodiment, where the electrodes 160 are linked sequentially by thin wires 170 along the edge of the sensor 110. In this instance, the wire diameter must be small compared to the minor radius of the magnetic resonance sensor.

In another embodiment, a combination of wires run across the aperture and segments of wire joining consecutive electrodes to enable formation of an equipotential across the multi-electrode structure.

In such arrangements, the capacitance between each electrode and the magnetic resonance sensor is large compared to the capacitance between the electrode and the disturbing voltage source. The impedance of the wires joining the electrodes is small compared to the electrode-sensor capacitance. Under these circumstances conductively joined electrodes essentially act as one single equipotential. Since electrodes are joined across the axis of symmetry, the electrodes act to provide a symmetrised voltage distribution across the magnetic resonance sensor. This symmetric voltage distribution is subsequently rejected by the isolation circuit and compensation circuit (in embodiments employing a compensation circuit). The multiple electrodes cannot be replaced with one single floating electrode; it is important to maintain some discontinuity between electrodes.

It is advantageous if the electrodes are made of conducting material having thickness much less than the material electrical skin depth. This reduces the losses in the electrodes. It is also beneficial if the electrodes are shaped to conform to a surface parallel to the surface of the magnetic resonance sensor. That is, if the surface of the voltage distribution electrode is uniformly spaced from the surface of the magnetic resonance sensor. This reduces current proximity effects in the electrodes.

The electrodes are advantageously combined with embodiments simultaneously employing the isolation circuit, and optionally with those also employing a compensation circuit. It will be appreciated that the isolation and compensation circuits do not require the electrode arrangement for useful operation.

Persons skilled in the art will appreciate that a number of variations can be made to the above embodiments. In particular, it will be appreciated that a subset of the above components can be combined in alternative embodiments.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art, in Australia or any other country.

The invention claimed is:

1. An apparatus for detecting magnetic resonance signals from a target, comprising:
   a magnetic resonance sensor for responding to magnetic resonance signals from a target;
   a shield member electrically isolated from the magnetic resonance sensor, the shield member being dish-shaped so as to define a concave side and an opposing convex side and positioned relative to the magnetic resonance sensor such that when the magnetic resonance sensor faces the target, the shield member is behind the magnetic resonance sensor to at least partially shield the magnetic resonance sensor from magnetically coupling with sources other than the magnetic resonance signals; and
   a magnetic resonator, the magnetic resonator electrically isolated from the shield member and the magnetic resonance sensor, the magnetic resonator being adapted to resonate and scatter a magnetic field towards the target to at least partially compensate for magnetic coupling of sources of interfering magnetic fields other than the target with the magnetic resonance sensor.

2. The apparatus as claimed in claim 1, wherein the magnetic resonance sensor is positioned on the concave side of the shield member.

3. The apparatus as claimed in claim 1, wherein the magnetic resonator is positioned on the convex side of the shield member.

4. The apparatus as claimed in claim 2, wherein the magnetic resonance sensor is encompassed within the shield member.

5. The apparatus as claimed in claim 1, wherein the shield member is encircled by the magnetic resonator.

6. The apparatus as claimed in claim 1, wherein
the magnetic resonance sensor comprises a first tuning element adapted to tune the magnetic resonance sensor to operate at about a predetermined operating frequency; and
the magnetic resonator comprises a second tuning element adapted to tune the magnetic resonator to a resonance below the predetermined operating frequency.

7. The apparatus as claimed in claim 1, wherein the magnetic resonance sensor and the magnetic resonator are substantially circular.

8. The apparatus as claimed in claim 1, wherein a depth of the concavity of the shield member is at least 30% of a diameter of the magnetic resonance sensor.

9. The apparatus as claimed in claim 1, wherein the shield member comprises a plurality of perforations.

10. The apparatus as claimed in claim 9, wherein the shield member is composed of a mesh.

11. The apparatus as claimed in claim 1, wherein the magnetic resonance sensor is a single turn loop or ribbon.

12. The apparatus as claimed in claim 1, wherein the magnetic resonance sensor is a multi-turn loop or ribbon.

13. The apparatus as claimed in claim 1, wherein the magnetic resonator is a single turn loop or ribbon.

14. The apparatus as claimed in claim 1, wherein the magnetic resonator is a multi turn loop or ribbon.

15. The apparatus as claimed in claim 1, further comprising:
an output; and
an isolation circuit arranged between the magnetic resonance sensor and the output to transfer electrical energy from the magnetic resonance sensor to the output while reducing electrical energy electrically coupled to the magnetic resonance sensor from transferring to the output.

16. The apparatus as claimed in claim 15, further comprising a compensation circuit connected to the isolation circuit and the output to compensate for electrical energy due to electric coupling within the isolation circuit.

17. The apparatus as claimed in claim 15, wherein the isolation circuit is an isolation transformer.

18. The apparatus as claimed in claim 16, wherein the compensation circuit comprises:
a capacitor connected to a primary winding of an isolation transformer; and
a voltage inverting circuit connected to the capacitor.

19. The apparatus as claimed in claim 18, wherein the capacitor is connected halfway along the length of the primary winding of the isolation transformer.

20. The apparatus as claimed in claim 18, wherein the inverting circuit is a 1:1 impedance ratio transformer with counter-fed windings.

21. The apparatus as claimed in claim 15, wherein the magnetic resonance sensor comprises an inductor and at least one capacitor.

22. The apparatus as claimed in claim 21, wherein there are an even number of capacitors arranged symmetrically relative to the inductor.

23. The apparatus as claimed in claim 21, wherein the inductor is a single turn inductive loop or ribbon.

24. The apparatus as claimed in claim 21, wherein the inductor is a multi-turn inductive coil.

25. An apparatus for detecting magnetic resonance signals from a target, comprising:
a magnetic resonance sensor for responding to magnetic resonance signals from a target;
a shield member electrically isolated from the magnetic resonance sensor, the shield member being dish-shaped so as to define a concave side and an opposing convex side and positioned relative to the magnetic resonance sensor such that when the magnetic resonance sensor faces the target, the shield member is behind the magnetic resonance sensor to at least partially shield the magnetic resonance sensor from magnetically coupling with sources other than the magnetic resonance signals:
an output;
an isolation circuit having an isolation transformer, arranged between the magnetic resonance sensor and the output to transfer electrical energy from the magnetic resonance sensor to the output while reducing electrical energy electrically coupled to the magnetic resonance sensor from transferring to the output; and
at least one pair of voltage distribution electrodes in proximity to, but electrically isolated from, the magnetic resonance sensor, each pair of voltage distribution electrodes being arranged symmetrically relative to a line of symmetry defined by a midline of the magnetic resonance sensor which extends through the isolation circuit, the voltage distribution electrodes being electrically connected to enable formation of an equipotential.

26. The apparatus as claimed in claim 25, wherein at least one pair of voltage distribution electrodes is connected by an electrical connector extending across an aperture of the magnetic resonance sensor.

27. The apparatus as claimed in claim 25, wherein the voltage distribution electrodes are linked by an electrical connector extending along an edge of the magnetic resonance sensor.

28. The apparatus as claimed in claim 26, wherein there are at least two pairs of voltage distribution electrodes and some of the electrodes are linked by electrical connectors extending between neighboring electrodes.

29. The apparatus as claimed in claim 25, wherein a thickness of each voltage distribution electrode is less than an electrical skin depth of a material from which each voltage distribution electrode is formed.

30. The apparatus as claimed in claim 25, wherein a surface of each voltage distribution electrode is uniformly spaced from the magnetic resonance sensor.

* * * * *